United States Patent
Lee et al.

(10) Patent No.: US 9,887,706 B2
(45) Date of Patent: Feb. 6, 2018

(54) FRAME HEADER TRANSMITTING DEVICE AND METHOD OF TRANSMITTING FRAME HEADER USING THE SAME

(71) Applicant: Electronics and Telecommunications Research Institute, Daejeon (KR)

(72) Inventors: Hoo Sung Lee, Sejong-si (KR); Ik Jae Chun, Daejeon (KR); Moon-Sik Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 260 days.

(21) Appl. No.: 14/736,748

(22) Filed: Jun. 11, 2015

(65) Prior Publication Data
US 2016/0127949 A1    May 5, 2016

(30) Foreign Application Priority Data
Oct. 29, 2014  (KR) .................. 10-2014-0148686

(51) Int. Cl.
*H04J 3/24*   (2006.01)
*H04B 15/00*   (2006.01)
*H03M 13/09*   (2006.01)
*H04L 1/00*   (2006.01)

(52) U.S. Cl.
CPC ......... *H03M 13/096* (2013.01); *H03M 13/09* (2013.01); *H04L 1/001* (2013.01)

(58) Field of Classification Search
None
See application file for complete search history.

(56) References Cited

U.S. PATENT DOCUMENTS

| 2004/0170157 | A1* | 9/2004 | Kim ................. | H04B 1/71635 370/349 |
| 2006/0104300 | A1* | 5/2006 | Ho ...................... | H04L 1/0083 370/428 |
| 2009/0122987 | A1* | 5/2009 | Mo ...................... | H04L 1/1685 380/277 |
| 2011/0044271 | A1* | 2/2011 | Hong ................. | H04W 28/06 370/329 |
| 2013/0294347 | A1 | 11/2013 | Das et al. | |

FOREIGN PATENT DOCUMENTS

KR    1020100035587 A    4/2010

* cited by examiner

*Primary Examiner* — Edan Orgad
*Assistant Examiner* — Sithu Ko
(74) *Attorney, Agent, or Firm* — William Park & Associates Ltd.

(57) ABSTRACT

A method of transmitting a frame header in wireless communication includes: forming a frame header by integrating a MAC header and a PHY header; repeatedly transmitting the frame header multiple times to a scrambler; and generating, by the scrambler, data by scrambling the repeatedly transmitted frame header with a specific code.

16 Claims, 7 Drawing Sheets

FIG. 3

| B31-b16 | b15 | B14-b12 | b11 | b10 | B9-b8 | b7-b4 | b3-b1 | b0 |
|---|---|---|---|---|---|---|---|---|
| Payload Length | reserved | Frame rate | reserved | Bit reversal | Scrambler | reserved | Protocol Version | reserved |

FIG. 4

| B15-b14 | B13-b12 | B11-b8 | B7 | b6 | b5-b4 | B3-b0 |
|---|---|---|---|---|---|---|
| reserved | Frame type | Frame Sub-type | reserved | retry | ACK Policy | Protocol Version |

FIG. 5

| B15 | b14-b4 | b3 | B2-b0 |
|---|---|---|---|
| reserved | Sequence Number | More Fragments | Fragment Number |

FRAME HEADER TRANSMITTING DEVICE AND METHOD OF TRANSMITTING FRAME HEADER USING THE SAME

CROSS-REFERENCE TO RELATED APPLICATION

This application claims priority to and the benefit of Korean Patent Application No. 10-2014-0148686 filed in the Korean Intellectual Property Office on Oct. 29, 2014, the entire contents of which are incorporated herein by reference.

BACKGROUND OF THE INVENTION (a) Field of the Invention

The present invention relates to a frame header transmitting device and a method of transmitting a frame header using the same.

(b) Description of the Related Art

In conventional wireless communication technology, when transmitting data, many errors are added to a transmitting signal, compared with wire communication. Therefore, in order to remove an error that is added while passing through an RF channel, wireless communication technology performs strong coding on an error in the RF channel when transmitting data.

Particularly, because a frame header includes important information on frame demodulation and decoding, when an error is included in the header, an entire frame may not be used. Therefore, by performing stronger channel coding in the header, transmission efficiency is enhanced.

Further, even if a header is received without an error, when an error that cannot be restored is included in a payload, a frame may not be used. Therefore, somewhat stronger coding than that of a payload is performed rather than performing very strong coding in the header. Therefore, when a payload is normally demodulated and decoded, header coding of a level in which an error may not occur is necessary in the header.

Because conventional wireless communication technology determines a maximum communication distance and a specification that each communication technology uses as a target, in order to guarantee a data rate at a maximum communication distance, the conventional wireless communication technology uses strong modulation/demodulation and coding technology. In conventional wireless communication technology, development complexity increases, and much power consumption occurs for communication.

Nowadays, while wireless communication using minimum power at a near distance of 10 cm or less such as Near Field Communication (NFC) is activated, a new service using NFC is used. However, because there is a restriction in new service activation due to a limitation of a communication speed using NFC, a low power high speed communication method at a near distance is requested.

However, because information for demodulating and decoding a payload is included in the header, when decoding of the header is delayed, demodulation of the payload is not performed and a receiving signal should be stored in a buffer. Therefore, in high speed communication, because much data are transmitted in a short time, even if decoding delay of header information is short, there is a difficulty that a large amount of receiving signals should be stored using a buffer of a large capacity.

SUMMARY OF THE INVENTION

The present invention has been made in an effort to provide a frame header transmitting device and a method of transmitting a frame header having advantages of being capable of transmitting a frame header with low power in near distance low power high speed wireless communication.

An exemplary embodiment of the present invention provides a method of transmitting a frame header in wireless communication including: forming a frame header by integrating a MAC header and a PHY header; repeatedly transmitting multiple times the frame header to a scrambler; and generating, by the scrambler, data by scrambling the repeatedly transmitted frame header with a specific code.

The forming of a frame header may include performing header checksum (HCS) of an entire frame header in order to verify an error of the frame header, and the performing of header checksum (HCS) may include performing the header checksum of the entire frame header only one time.

The repeatedly transmitting may include transmitting a normal frame header upon transmitting at odd numbered times and transmitting a frame header that is inverted in a bit unit upon transmitting at even numbered times.

The scrambling of the repeatedly transmitted frame header may include generating the data by performing an exclusive OR (XOR) operation of the repeatedly transmitted frame header and a signal that is generated in a linear feedback shift register (LFSR).

The method may further include transmitting the data that is generated in the scrambler to the outside through a radio frequency (RF) channel.

The frame header may include Destination UID and Source UID of transmitting and receiving devices, Frame Control for analyzing data that is included in a payload, Sequence Control related to overlapping prevention and piece information of a payload, and header checksum (HCS) for verifying an error of a header.

The PHY header may include a Payload Length, a Frame Rate including previously defined modulation and decoding information, Bit reversal including reversal information of a bit, a scrambler of the scrambler, and a protocol version for decoding a PHY header.

The frame control information may include a MAC Protocol Version, an ACK Policy notifying whether to ACK, retry notifying whether a retransmission frame, a frame type notifying a payload kind, and a Frame Sub-type designating a frame sub-type according to a frame type.

The sequence control information may include a fragment number of one frame, more fragments notifying whether additional fragment exists, and Sequence Number for preventing overlapping or loss of a frame.

Another embodiment of the present invention provides a frame header transmitting device including: a header configuration unit that forms one frame header by integrating a MAC header and a PHY header; a scrambler that repeatedly receives the frame header from the header configuration unit and that generates data by scrambling the repeatedly received frame header with a specific code; and a signal transmitting unit that transmits the data to the outside through a radio frequency (RF) channel.

The header configuration unit may repeatedly transmit the frame header to the scrambler at odd numbered times.

The header configuration unit may transmit a normal frame header upon transmitting at odd numbered times and transmits a frame header that is inverted in a bit unit upon transmitting at even numbered times.

The header configuration unit may perform Header checksum (HCS) of the entire frame header in order to verify an error of the frame header, but perform the header checksum only one time.

The scrambler may generate the data by performing an exclusive OR (XOR) operation of the repeatedly transmitted frame header and a signal that is generated at a linear feedback shift register (LFSR).

The frame header may include Destination UID and Source UID of transmitting and receiving devices, frame control for analyzing data that is included in a payload, Sequence Control related to overlapping prevention and piece information of a payload, and header checksum (HCS) for verifying an error of a header.

The PHY header may include a payload length, a frame rate including previously defined modulation and decoding information, bit reversal including reversal information of a bit, a scrambler of the scrambler, and protocol version for decoding a PHY header.

The frame control information may include MAC Protocol Version, an ACK Policy notifying whether to ACK, retry notifying whether a retransmission frame, a frame type notifying a payload kind, and a Frame Sub-type designating a frame sub-type according to a frame type.

The sequence control information may include a fragment number of one frame, more fragments notifying whether additional fragment exists, and a Sequence Number for preventing overlapping or loss of a frame.

According to an exemplary embodiment of the present invention, a delay time necessary for header decoding is reduced through a header structure appropriate to near distance low power high speed wireless communication, and by providing a method of transmitting a frame header in which coding and decoding for restoring an added error in an RF channel is not complex, an environment that can reduce an implementation cost and complexity of a transceiver is provided.

BRIEF DESCRIPTION OF THE DRAWINGS

FIG. 3 is a diagram illustrating a format of a PHY header according to an exemplary embodiment of the present invention.

FIG. 4 is a diagram illustrating frame control information according to an exemplary embodiment of the present invention.

FIG. 5 is a diagram illustrating sequence control information according to an exemplary embodiment of the present invention.

DETAILED DESCRIPTION OF THE EMBODIMENTS

Figure 1:
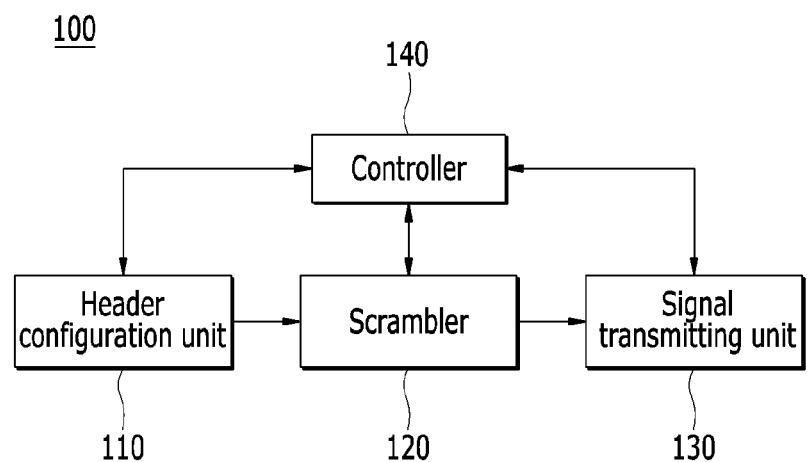
FIG. 1 is a block diagram illustrating a frame header transmitting device according to an exemplary embodiment of the present invention.

In the following detailed description, only certain exemplary embodiments of the present invention have been shown and described, simply by way of illustration. However, as those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

In addition, in an entire specification, unless explicitly described to the contrary, the word "comprise" and variations such as "comprises" or "comprising" will be understood to imply the inclusion of stated elements but not the exclusion of any other elements.

Further, the terms "-er" and "module" described in the specification mean units for processing at least one function and operation, and can be implemented by hardware components or software components and combinations thereof.

Hereinafter, a frame header transmitting device and a method of transmitting a frame header using the same according to an exemplary embodiment of the present invention will be described in detail with reference to the drawings.

FIG. 1 is a block diagram illustrating a frame header transmitting device according to an exemplary embodiment of the present invention. In this case, the frame header transmitting device describes only a schematic configuration necessary for description according to an exemplary embodiment of the present invention, and is not limited to such a configuration.

Referring to FIG. 1, when transmitting a transmitting frame through a physical layer, a frame header transmitting device 100 according to an exemplary embodiment of the present invention can reduce complexity of a transmitter and a receiver and transmit a frame header with low power. Here, the transmitting frame includes a preamble for synchronization and channel estimation, a header that stores information of a payload, and a payload that include data.

According to an exemplary embodiment of the present invention, the frame header transmitting device 100 includes a header configuration unit 110, a scrambler 120, a signal transmitting unit 130, and a controller 140.

The header configuration unit 110 is formed with a frame header by integrating a MAC header and a Physical (PHY) header. The header configuration unit 110 repeatedly transmits the frame header to the scrambler 120, and according to an exemplary embodiment of the present invention, the header configuration unit 110 may repeatedly transmit a frame header at odd-numbered times.

In this case, the header configuration unit 110 may transmit a normal frame header upon transmitting at odd-numbered times and transmit a frame header that is inverted in a bit unit upon transmitting at even-numbered times.

In order to verify an error of the frame header, the header configuration unit 110 performs header checksum (HCS) of an entire frame header. In this case, the header configuration unit 110 performs HCS only one time.

The scrambler 120 repeatedly receives a frame header from the header configuration unit 110 and generates data by scrambling the repeatedly received frame header with a specific code. In this case, the scrambler 120 may generate data by performing an exclusive OR (XOR) operation of the frame header and a signal that is generated in a linear feedback shift register (LFSR).

The signal transmitting unit 130 transmits data that is generated in the scrambler 120 to the outside through an RF channel.

The controller 140 controls to smoothly perform each operation of the header configuration unit 110, the scrambler 120, and the signal transmitting unit 130. Further, the controller 140 controls the header configuration unit 110 to repeatedly transmit a frame header to the scrambler 120, and controls the signal transmitting unit 130 to transmit data that is generated in the scrambler 120 to the outside.

Figure 2:
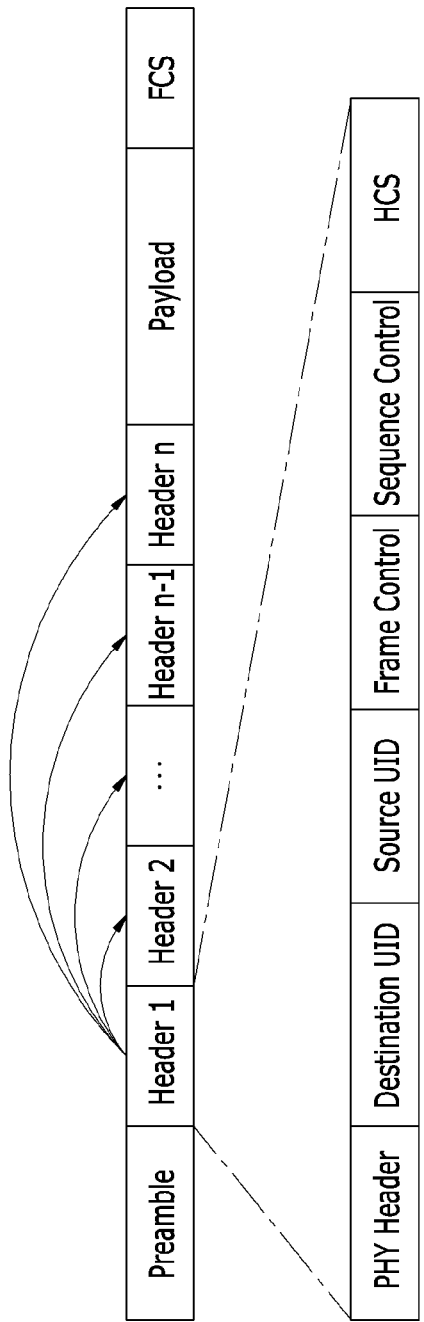
FIG. 2 is a diagram illustrating a format of a frame header and a transmitting structure of a frame header according to an exemplary embodiment of the present invention.

FIG. 2 is a diagram illustrating a format of a frame header and a transmitting structure of a frame header according to an exemplary embodiment of the present invention.

According to an exemplary embodiment of the present invention, the frame header processes a MAC header and a PHY header in one unit. In most conventional wireless communication technology, MAC and PHY are clearly divided by taking an independent layer, and thus in each layer, a MAC header and a PHY header were divided and processed.

However, in near distance low power data communication to which the present invention is applied, in order to reduce power consumption and complexity, as shown in FIG. 2, the MAC header and the PHY header are processed into one header by integrating them, and in order to verify an error of the header, checksum of an entire header is used only one time.

Here, the frame header includes a PHY header necessary for performing demodulation and decoding of a payload, Destination UID and Source UID of transmitting and receiving devices, Frame Control for analyzing data that is included in a payload, Sequence Control related to overlapping prevention and piece information of a payload, and header checksum (HCS) for verifying an error of a header.

FIG. 3 is a diagram illustrating a format of a PHY header according to an exemplary embodiment of the present invention.

As shown in FIG. 3, the PHY header includes a Payload Length, a Frame Rate including previously defined modulation and decoding information, bit reversal including reversal information of a bit, a Scrambler of the scrambler, and a protocol version for decoding the PHY header. In the PHY header, a Least Significant Bit (LSB) is first transmitted in order from b0 to b31.

Source UID of a transmitting device and Destination UID of a receiving device each use 8 bytes (64 bits), and have an intrinsic identifier of each device. An identifier of the receiving device may designate several devices at one time.

FIG. 4 is a diagram illustrating frame control information according to an exemplary embodiment of the present invention.

As shown in FIG. 4, frame control information includes a MAC protocol version, an ACK Policy notifying whether to ACK, retry notifying of a retransmission frame, a frame type notifying a payload kind, and a frame sub-type that designates a frame sub-type according to a frame type.

FIG. 5 is a diagram illustrating sequence control information according to an exemplary embodiment of the present invention.

As shown in FIG. 5, sequence control information includes a fragment number of one frame, More Fragments notifying whether additional fragments exist, and Sequence Number for preventing overlapping or loss of a frame.

Figure 6:
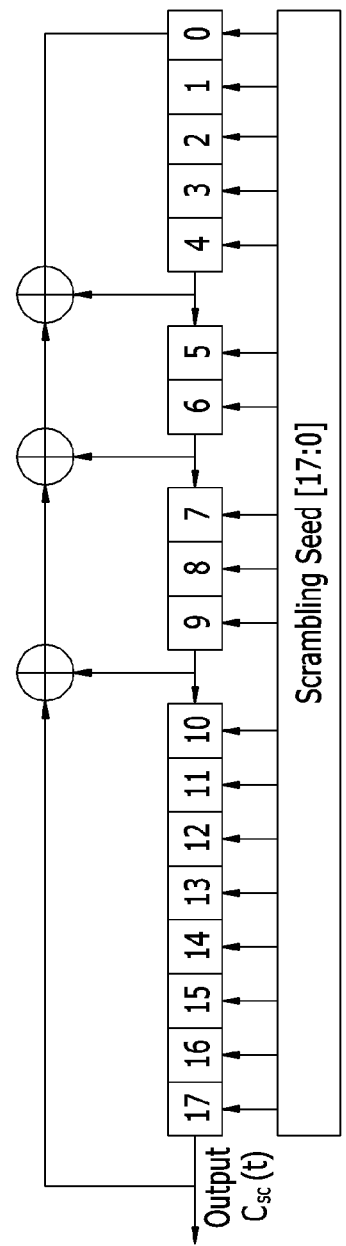
FIG. 6 is a diagram illustrating a linear feedback shift register (LFSR) of a scrambler according to an exemplary embodiment of the present invention.

FIG. 6 is a diagram illustrating an LFSR of a scrambler according to an exemplary embodiment of the present invention.

The scrambler 120 generates data through an exclusive OR (XOR) operation of a frame header and a signal that is generated in a linear feedback shift register (LFSR).

Here, a polynomial equation of the LFSR that is used in the scrambler 120 is Equation 1.

$$G(x) = x^{18} + x^{10} + x^7 + x^5 + 1 \quad \text{(Equation 1)}$$

Figure 7:
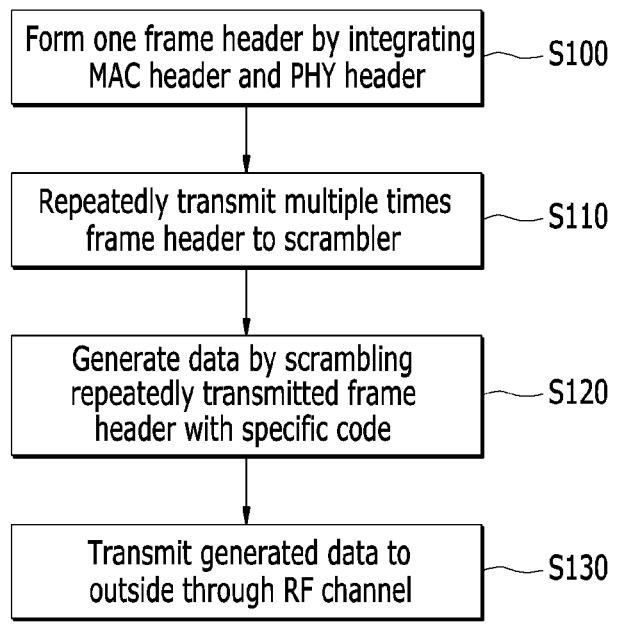
FIG. 7 is a flowchart illustrating a method of transmitting a frame header according to another exemplary embodiment of the present invention.

FIG. 7 is a flowchart illustrating a method of transmitting a frame header according to another exemplary embodiment of the present invention. The following flowchart will be described with the same reference numerals as that of a configuration of FIG. 1.

Referring to FIG. 7, in the frame header transmitting device 100, the header configuration unit 110 forms one frame header by integrating a MAC header and a PHY header (S100).

The frame header transmitting device 100 repeatedly transmits the frame header multiple times to the scrambler 120 (S110), and the scrambler 120 generates data by scrambling the repeatedly transmitted frame header with a specific code (S120).

In this way, a method of transmitting a frame header according to an exemplary embodiment of the present invention uses a method of repeatedly transmitting N times and scrambling an entire header of a frame. When repeatedly transmitting an entire header, as in an exemplary embodiment of the present invention, an interleaving effect occurs, and thus the method is strong on a burst error, compared with a case of repeating a bit N times. Further, in an exemplary embodiment of the present invention, even if an error corresponding to half of the repetition number occurs, the data can be restored.

In an exemplary embodiment of the present invention, in order to easily perform decoding, the repetition number is repeatedly performed at odd-numbered times. For example, in an exemplary embodiment of the present invention, the header may be repeatedly transmitted 5 times. In this way, when repeatedly transmitting 5 times, even if an error of about 40% occurs, the data may be normally restored and thus stronger coding than coding that is applied to most payloads is performed.

In an exemplary embodiment of the present invention, when repeatedly transmitting a header, in order to reduce an error by channel characteristics, a bit may be inverted and transmitted whenever repeating. In order words, when transmitting a header at odd-numbered times such as first, third, and fifth, a normal header may be transmitted, and when transmitting a header at even-numbered times such as second and fourth, a header may be immediately transmitted or a header that is inverted in a bit unit may be transmitted.

Therefore, a repeated header randomly occurs through scrambling before transmitting to an RF channel. For example, in an exemplary embodiment of the present invention, when 0 or 1 are continuously entered, 0 or 1 does not continuously occur through operation with a specific code. Further, in an exemplary embodiment of the present invention, by appropriately maintaining bit shift, the receiving side may restore a clock.

In the frame header transmitting device 100, the signal transmitting unit 130 transmits data that is generated in the scrambler 120 to the outside through an RF channel (S130).

In this way, an apparatus and method for transmitting a header according to an exemplary embodiment of the present invention provide an environment that can reduce a delay time necessary for header decoding through a header structure appropriate to near distance low power high speed wireless communication.

In an exemplary embodiment of the present invention, by providing a method of transmitting a frame header in which coding and decoding for restoring an error that is added in an RF channel is not complex, an environment that can reduce an implementation cost and complexity of a transceiver is provided.

The foregoing exemplary embodiment of the present invention may not only be embodied through an apparatus and a method, but may also be embodied through a program that executes a function corresponding to a configuration of the exemplary embodiment of the present invention or through a recording medium on which the program is recorded.

DESCRIPTION OF SYMBOLS

| 110: header configuration unit | 120: scrambler |
| 130: signal transmitting unit | 140: controller |

What is claimed is:

1. A method of transmitting a frame header in wireless communication, the method comprising:
   forming a frame header by integrating a media access control (MAC) header and a physical layer (PHY) header;
   repeatedly transmitting the frame header multiple times to a scrambler; and
   generating, by the scrambler, data by scrambling the repeatedly transmitted frame header with a specific code,
   wherein the repeatedly transmitting comprises transmitting a normal frame header upon transmitting at odd-numbered times and transmitting a frame header that is inverted in a bit unit upon transmitting at even-numbered times.

2. The method of claim 1, wherein the forming of a frame header comprises performing header checksum (HCS) of an entire frame header in order to verify an error of the frame header, and the performing of header checksum (HCS) comprises performing the HCS of the entire frame header only one time.

3. The method of claim 1, wherein the scrambling of the repeatedly transmitted frame header comprises generating the data by performing an exclusive OR (XOR) operation of the repeatedly transmitted frame header and a signal that is generated in a linear feedback shift register (LFSR).

4. The method of claim 3, further comprising transmitting the data that is generated in the scrambler to the outside through a radio frequency (RF) channel.

5. The method of claim 1, wherein the frame header comprises Destination user identifier (UID) and Source UID of transmitting and receiving devices, Frame Control for analyzing data that is included in a payload, Sequence Control related to overlapping prevention and piece information of a payload, and header checksum (HCS) for verifying an error of a header.

6. The method of claim 5, wherein the PHY header comprises a Payload Length, a Frame Rate including previously defined modulation and decoding information, Bit reversal including reversal information of a bit, a Scrambler of the scrambler, and a protocol version for decoding a PHY header.

7. The method of claim 5, wherein the frame control information comprises a MAC Protocol Version, an acknowledgement (ACK) Policy notifying whether to ACK, retry notifying of a retransmission frame, a frame type notifying a payload kind, and a Frame Sub-type designating a frame sub-type according to a frame type.

8. The method of claim 5, wherein the sequence control information comprises a fragment number of one frame, more fragments notifying whether additional fragments exist, and Sequence Number for preventing overlapping or loss of a frame.

9. A frame header transmitting device, comprising:
   a header configuration unit that is controlled by a controller included in the frame header transmitting device and that forms one frame header by integrating a media access control (MAC) header and a physical layer (PHY) header;
   a scrambler that is controlled by a controller included in the frame header transmitting device and that repeatedly receives the frame header from the header configuration unit and that generates data by scrambling the repeatedly received frame header with a specific code; and
   a signal transmitting unit that is controlled by a controller included in the frame header transmitting device and that transmits the data to the outside through a radio frequency (RF) channel,
   wherein the header configuration unit transmits a normal frame header upon transmitting at odd-numbered times and transmits a frame header that is inverted in a bit unit upon transmitting at even-numbered times.

10. The frame header transmitting device of claim 9, wherein the header configuration unit repeatedly transmits the frame header to the scrambler at odd-numbered times.

11. The frame header transmitting device of claim 9, wherein the header configuration unit performs Header checksum (HCS) of the entire frame header in order to verify an error of the frame header, but performs the HCS only one time.

12. The frame header transmitting device of claim 11, wherein the scrambler generates the data by performing an exclusive OR (XOR) operation of the repeatedly transmitted frame header and a signal that is generated at a linear feedback shift register (LFSR).

13. The frame header transmitting device of claim 9, wherein the frame header comprises Destination user identifier (UID) and Source UID of transmitting and receiving devices, frame control for analyzing data that is included in a payload, Sequence Control related to overlapping prevention and piece information of a payload, and header checksum (HCS) for verifying an error of a header.

14. The frame header transmitting device of claim 13, wherein the PHY header comprises a payload length, a frame rate comprising previously defined modulation and decoding information, bit reversal including reversal information of a bit, a Scrambler of the scrambler, and protocol version for decoding a PHY header.

15. The frame header transmitting device of claim 13, wherein the frame control information comprises MAC Protocol Version, an acknowledgement (ACK) Policy notifying whether to ACK, retry notifying of a retransmission frame, a frame type notifying a payload kind, and a Frame Sub-type designating a frame sub-type according to a frame type.

16. The frame header transmitting device of claim 13, wherein the sequence control information comprises a fragment number of one frame, more fragments notifying whether additional fragments exist, and a sequence number for preventing overlapping or loss of a frame.

* * * * *